(12) United States Patent
Chen

(10) Patent No.: US 9,060,422 B2
(45) Date of Patent: Jun. 16, 2015

(54) ELECTRIC WIRING SEAT AND ASSEMBLY THEREOF

(71) Applicant: Yu-Syuan Chen, New Taipei (TW)

(72) Inventor: Yu-Syuan Chen, New Taipei (TW)

( * ) Notice: Subject to any disclaimer, the term of this patent is extended or adjusted under 35 U.S.C. 154(b) by 3 days.

(21) Appl. No.: 14/076,728

(22) Filed: Nov. 11, 2013

(65) Prior Publication Data
US 2015/0129294 A1     May 14, 2015

(51) Int. Cl.
*H05K 1/11* (2006.01)
*H05K 1/02* (2006.01)

(52) U.S. Cl.
CPC .... *H05K 1/0213* (2013.01); *H05K 2201/10613* (2013.01)

(58) Field of Classification Search
USPC ............... 174/262; 439/620.09, 709, 723
See application file for complete search history.

(56) References Cited

U.S. PATENT DOCUMENTS

| 6,176,747 B1 * | 1/2001 | Rowe et al. ............ 439/721 |
| 2004/0161975 A1 * | 8/2004 | Sakai et al. ............ 439/620 |

* cited by examiner

*Primary Examiner* — Andargie M Aychillhum
(74) *Attorney, Agent, or Firm* — Chun-Ming Shih; HDLS IPR Services

(57) ABSTRACT

A wiring seat includes an insulative base and a connecting member. The insulative base has a fixing hole and an engagement hole or a through hole beside the fixing hole. The connecting member has a conductive body. The conductive body is bendingly extended with a positioning sheet engaging with the engagement hole or a terminal pin passing the through hole. The conductive body has a passing hole corresponding to the fixing hole.

8 Claims, 9 Drawing Sheets

ELECTRIC WIRING SEAT AND ASSEMBLY THEREOF

BACKGROUND OF THE INVENTION

1. Technical Field

The invention relates to a wiring seat assembly, particularly to an electric wiring seat and assembly.

2. Related Art

Large-scaled machines, housings or apparatuses always need an electric wiring seat assembly to connect two wires. A conventional wiring seat assembly includes an insulative base with troughs. Each trough is provided with a connecting sheet, a pressing sheet and a screw. The bottom of the trough is formed with a hollow. The connecting sheet is formed with a screw hole corresponding to the hollow. The pressing sheet is formed with a through hole so that the screw passes the through hole, screw hole and hollow, and is fastened to the screw hole.

Wiring steps of using the above wiring seat assembly are: a) releasing the screw to separate the connecting sheet and pressing sheet and inserting a wire between the connecting sheet and pressing sheet; b) fastening the screw to clamp the wire; and c) connecting another wire to an end of the connecting sheet to connect these two wires.

However, the screw is screwed to only the screw hole of the connecting sheet, so fixing strength of the screw is not enough. Both the connecting sheet and the pressing sheet are easy to sway, deflect or shift against the insulative base. This will cause infirm connection of the wire between the connecting sheet and pressing sheet.

SUMMARY OF THE INVENTION

An object of the invention is to provide an electric wiring seat and assembly, which uses a screw to fasten an insulative base so that the invention has advantages of firm connection and easy operation.

To accomplish the above object, the electric wiring seat of the invention includes:

an insulative base, having at least one fixing hole; and at least one connecting member, having a conductive body with a passing hole corresponding to the fixing hole.

To accomplish the above object, the electric wiring assembly of the invention, used for a wire, includes:

an insulative base, having at least one fixing hole; and at least one connecting member, having a conductive body with a passing hole corresponding to the fixing hole and at least one screw passing through the passing hole and fastened to the fixing hole, wherein the wire is connected to the conductive body.

The invention also has advantages as follows:

1. The positioning sheet engages with the engagement hole and the screw is fastened to the fixing hole, so that the connecting member and the screw are firmly fastened to the insulative base. Thus, the wire is firmly clamped between the connecting sheet and the pressing sheet. The connection efficiency of the wiring seat assembly is increased.

2. The positioning sheet engages with the engagement hole, the terminal pin passes the through hole, and the screw passes the inserting hole and passing hole and is fastened to the fixing hole, so that the wiring seat assembly can connect the wire. Thus, the wiring seat assembly has an advantage of easy operation.

3. The connecting member has a conductive body. The conductive body is extended with positioning sheets and a terminal pin. The conductive body is formed with a passing hole corresponding to the fixing hole. The insulative base has a top with a fixing hole, an engagement hole and a through hole, so that the wiring seat assembly can connect the wire. Thus, the wiring seat assembly has advantages of simple structure, easy operation and low cost.

DETAILED DESCRIPTION OF THE INVENTION

Figure 1:
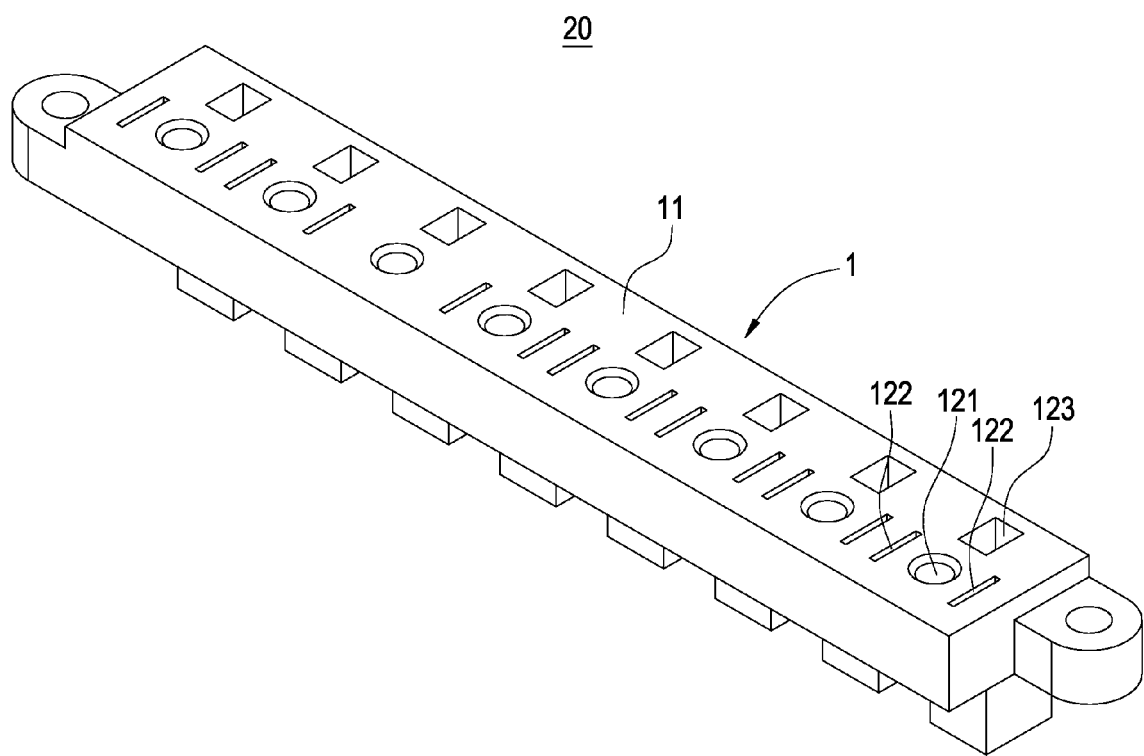
FIG. 1 is a perspective view of the wiring seat of the invention.

Please refer to FIGS. 1-6. The invention provides an electric wiring seat and assembly, which is used for a wire 100. The electric wiring seat assembly 10 includes an insulative base 1, one or more connecting member 2 and one or more screws 4. The electric wiring seat 20 includes an insulative base 1 and one or more connecting member 2.

As shown in FIG. 1, the insulative base 1 has a top 11 with one or more fixing holes 121, one or more engagement holes 122 beside each of the fixing holes and a through hole 123 separately beside each fixing hole 121.

In this embodiment, the numbers of the engagement holes 122 and positioning sheets are two. The two engagement holes 122 are located at two opposite lateral sides and the through hole 123 is located at the front or rear of the fixing hole 121, but not limited to this. Additionally, the fixing hole 121 may be provided with an inner thread 1211 or not.

Figure 4:
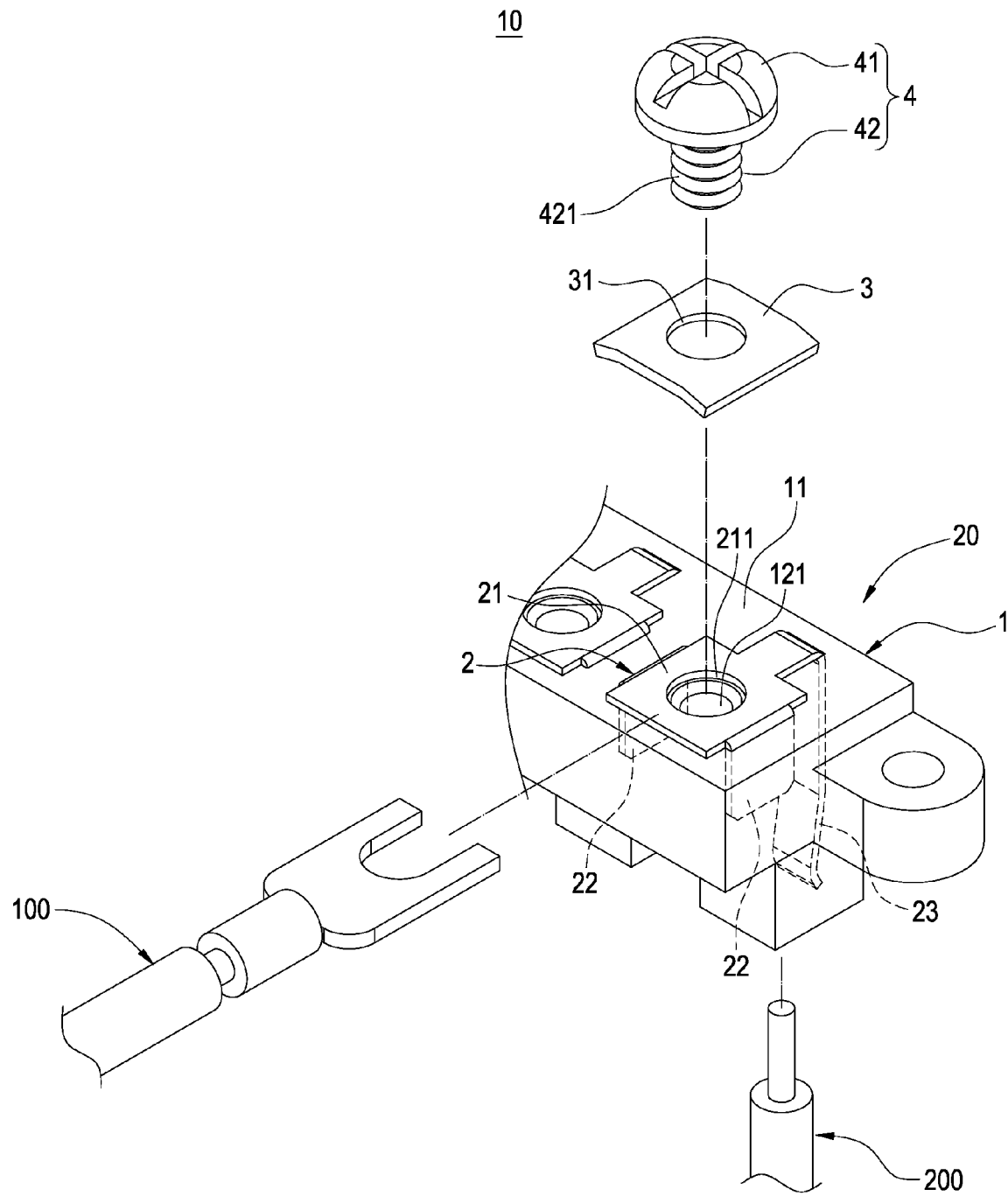
FIG. 4 is an exploded view of the wiring seat assembly of the invention.

As shown in FIG. 4, the number of the fixing holes 121 of this embodiment is plural, so the connecting members 2, pressing sheets 3 and screws 4 are four in number too. In this embodiment, the through hole 123 is located at the rear of the fixing hole 121, but not limited to this.

Figure 2:
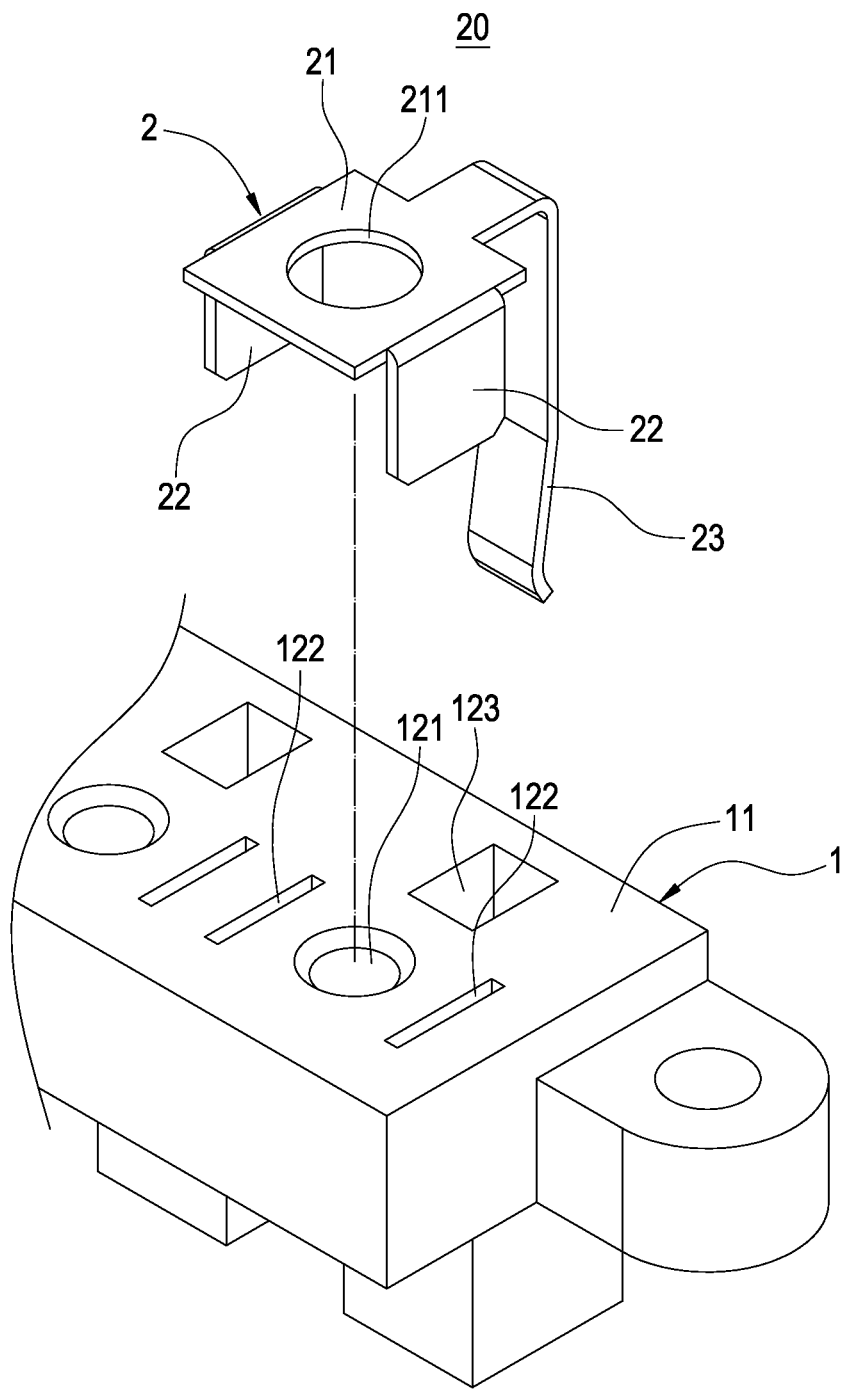
FIG. 2 is an exploded view of the wiring seat of the invention.
Figure 3:
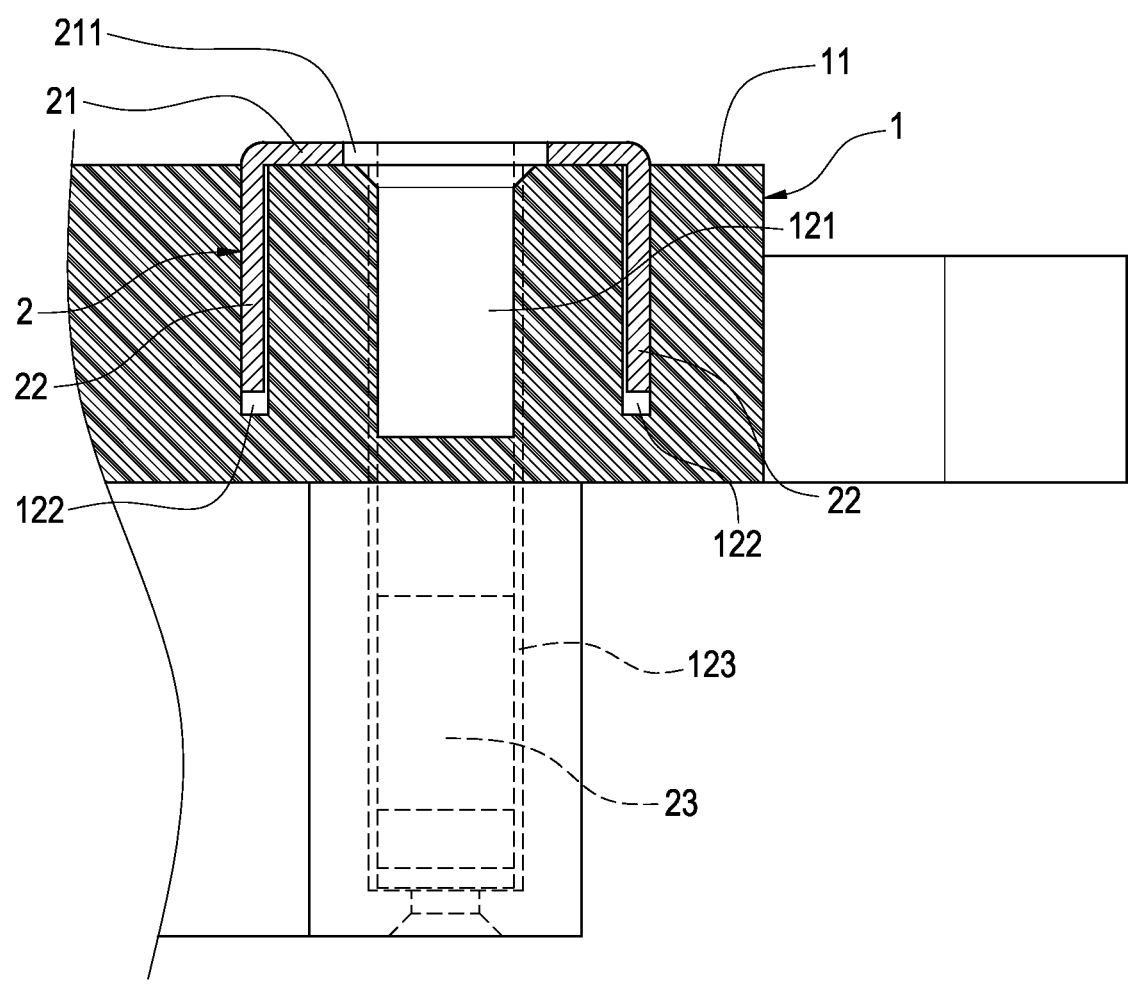
FIG. 3 is a cross-sectional view of the wiring seat of the invention.

As shown in FIGS. 2 and 3, each connecting member 2 has a conductive body 21. The conductive body 21 is extended with a pair of positioning sheets 22 separately engaging with the engagement holes 122 and a terminal pin 23 passing the through hole 123, so that the conductive body 21 is located on the bottom 12. The conductive body 21 is formed with a passing hole 211 corresponding to the fixing hole 121.

The terminal pin 23 provides a connection between two wires 100, 200. The terminal pin 23 is not limited to the shown shape.

As shown in FIG. 4, each pressing sheet 3 is located over the conductive body 21 and is formed with an inserting hole 31 corresponding to the passing hole 211.

Figure 5:
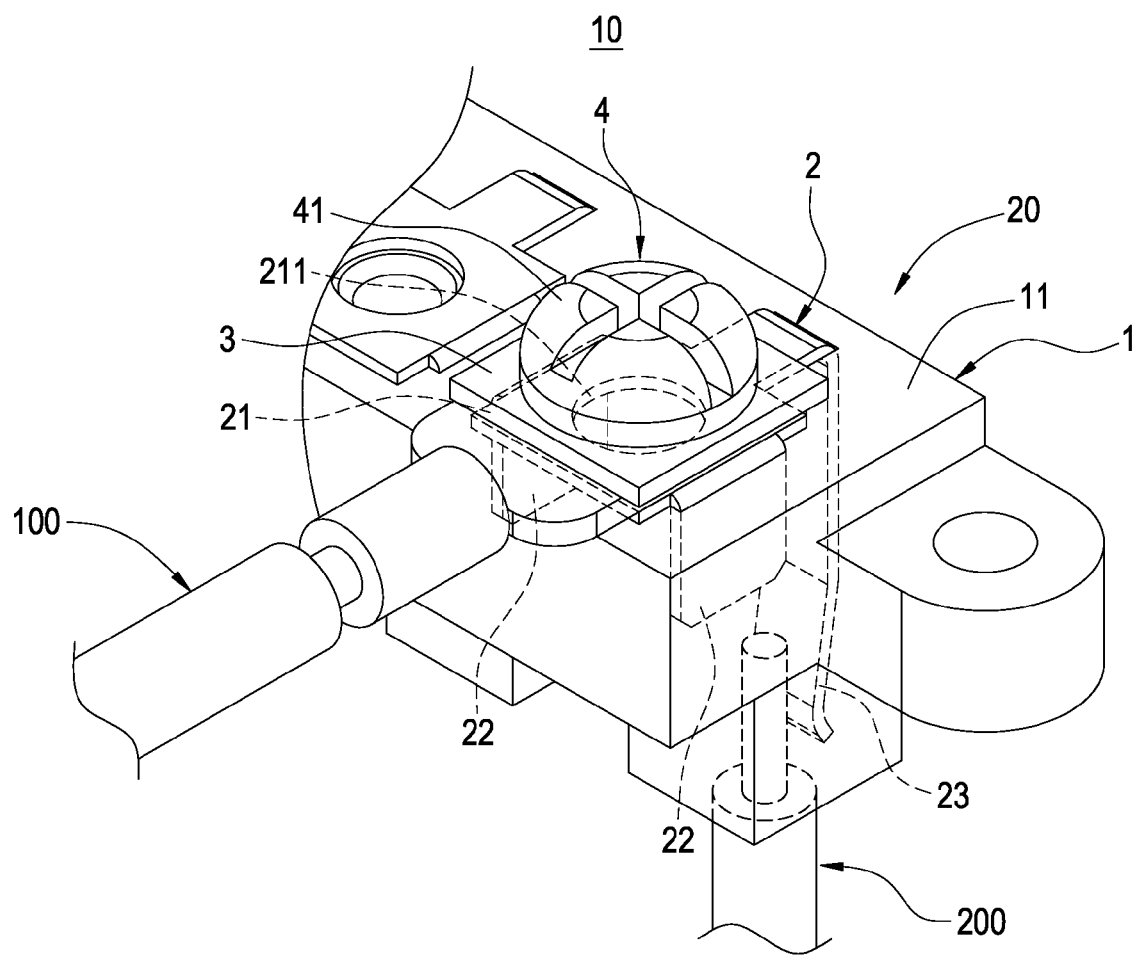
FIG. 5 is a perspective view of the wiring seat assembly of the invention.
Figure 6:
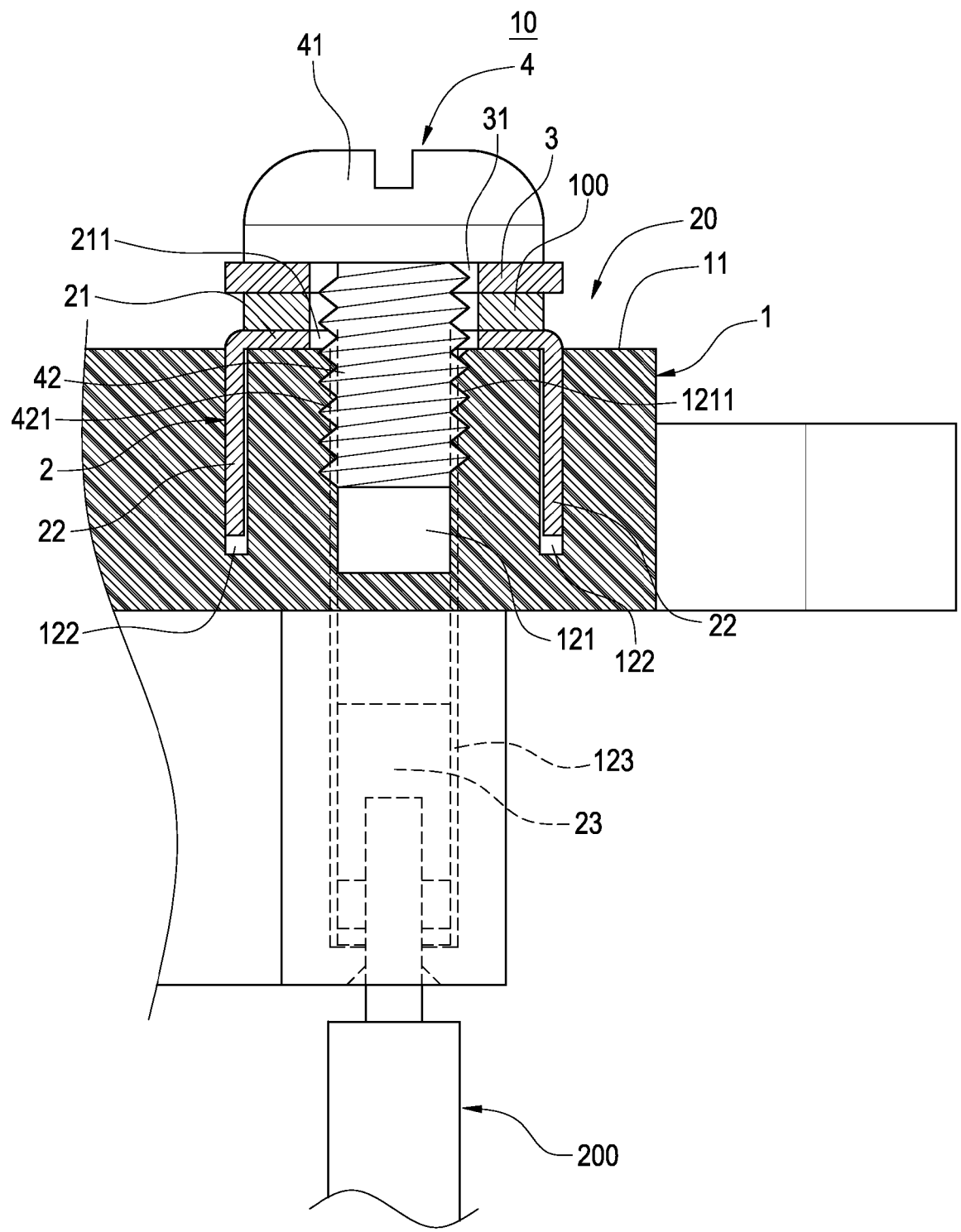
FIG. 6 is a cross-sectional view of the wiring seat assembly of the invention.

Please refer to FIGS. 4-6. Each screw 4 passes through the inserting hole 31 and passing hole 211, and is fastened to the fixing hole 121. The wire 100 is clamped between the conductive body 21 and the pressing sheet 3. The screw 4 has a head 41 and a rod 42 with an outer thread 421.

There are two manners to fastening the screw 4 into the fixing hole 121. The first manner is shown in FIGS. 3 and 6. The insulative body 1 is made of plastic and the screw 4 is made of metal. The fixing hole 121 has no thread. When fastening the screw 4, the outer thread 421 will rub and cut the fixing hole 121 to make the screw 4 embedded and fastened in the fixing hole 121. The second manner is shown in FIG. 6. The fixing hole 121 has an inner thread 1211 corresponding the outer thread 421 so that the screw 4 is fastened in the fixing hole 121.

The electric wiring seat assembly 10 of the invention includes an insulative base having a fixing hole 121 and a connecting member 2 having a conductive body 21 with a passing hole 211 corresponding to the fixing hole 121. The screw 4 passes through the passing hole 211 and is fastened to the fixing hole 121. The wire 100 is connected to the conductive body 21. Thereby, the screw 4 is fastened to the insulative body 1 to obtain advantages of firm connection and easy operation.

The electric wiring seat assembly 10, as shown in FIGS. 1-3, includes an insulative base having a fixing hole 121 and a connecting member 2 having a conductive body 21 with a passing hole 211 corresponding to the fixing hole 121. Thereby, the screw 4 is fastened to the insulative body 1 to obtain firm connection and easy operation. Thereby, the screw 4 is fastened to the insulative body 1 to obtain advantages of firm connection and easy operation.

FIGS. 4-6 show use of the wiring seat assembly 10 and the wiring seat 20. First, the positioning sheet 22 engages with the engagement hole 122, the terminal pin 23 passes through the through hole 123, and the connecting member 2 engages with the insulative base 1. Second, the wire 100 is inserted between the conductive body 21 and the pressing sheet 3. The screw 4 is inserted into the inserting hole 31 and passing hole 211 and fastened to the fixing hole 121 so that the wire 100 is clamped between the conductive body 21 and pressing sheet 3. Finally, the terminal pin 23 connects the wire 200 to make the two wires 100, 200 connected through the connecting member 2. Thereby, the positioning sheet 22 engages with the engagement hole 122 and the screw 4 is fastened to the fixing hole 121, so that the connecting member 2 and the screw 4 are firmly fastened to the insulative base 1. The connecting sheet 2 and pressing sheet 3 are not easy to deflect or shift even if the wiring seat assembly 10 is vibrated or pulled. That is, the wire 100 is firmly clamped between the connecting sheet 2 and the pressing sheet 3. The connection efficiency of the wiring seat assembly 100 is increased.

The positioning sheet 22 engages with the engagement hole 122, the terminal pin 23 passes the through hole 123, and the screw 4 passes the inserting hole 31 and passing hole 211 and is fastened to the fixing hole 121, so that the wiring seat assembly 100 can connect the wire 100. Thus, the wiring seat assembly 100 has an advantage of easy operation.

The connecting member 2 has a conductive body 21. The conductive body 21 is extended with positioning sheets and a terminal pin 23. The conductive body 21 is formed with a passing hole 211 corresponding to the fixing hole 121. The insulative base 1 has a top 11 with a fixing hole 121, an engagement hole 122 and a through hole 123, so that the wiring seat assembly 100 can connect the wire 100. Thus, the wiring seat assembly 100 has advantages of simple structure, easy operation and low cost.

The engagement holes 122 and the positioning sheets 22 are two in number. The two engagement holes 122 are located at two opposite lateral sides and the through hole 123 is located at the front or rear of the fixing hole 121. This make the connecting member 2 is firmly secured on the insulative base 1 to prevent the connecting member 2 and the wire 100 from vibrating. Thus, the connecting effect between the connecting member 2 and the wire 100 is enhanced.

Figure 7:
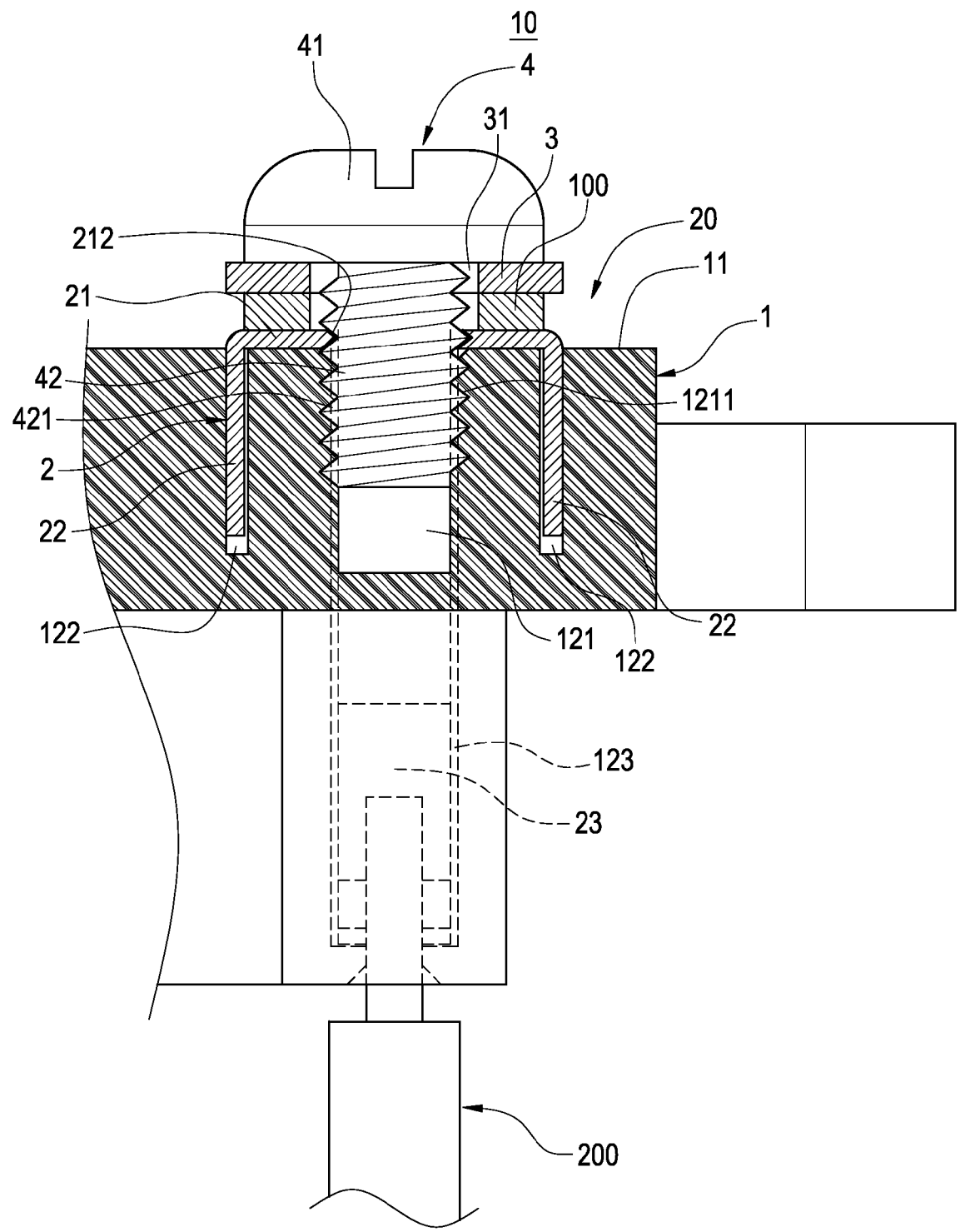
FIG. 7 is a cross-sectional view of another embodiment of the wiring seat assembly of the invention.

Please refer to FIG. 7, which shows the second embodiment of the invention. The second embodiment differs from the above embodiment by the passing hole with an inner thread 212. The screw 4 can be firmly fastened to the connecting member 2 by screwing between the inner thread 212 and the outer thread 421. This can enhance the coupling efficiency of the wiring seat assembly 10.

Figure 8:
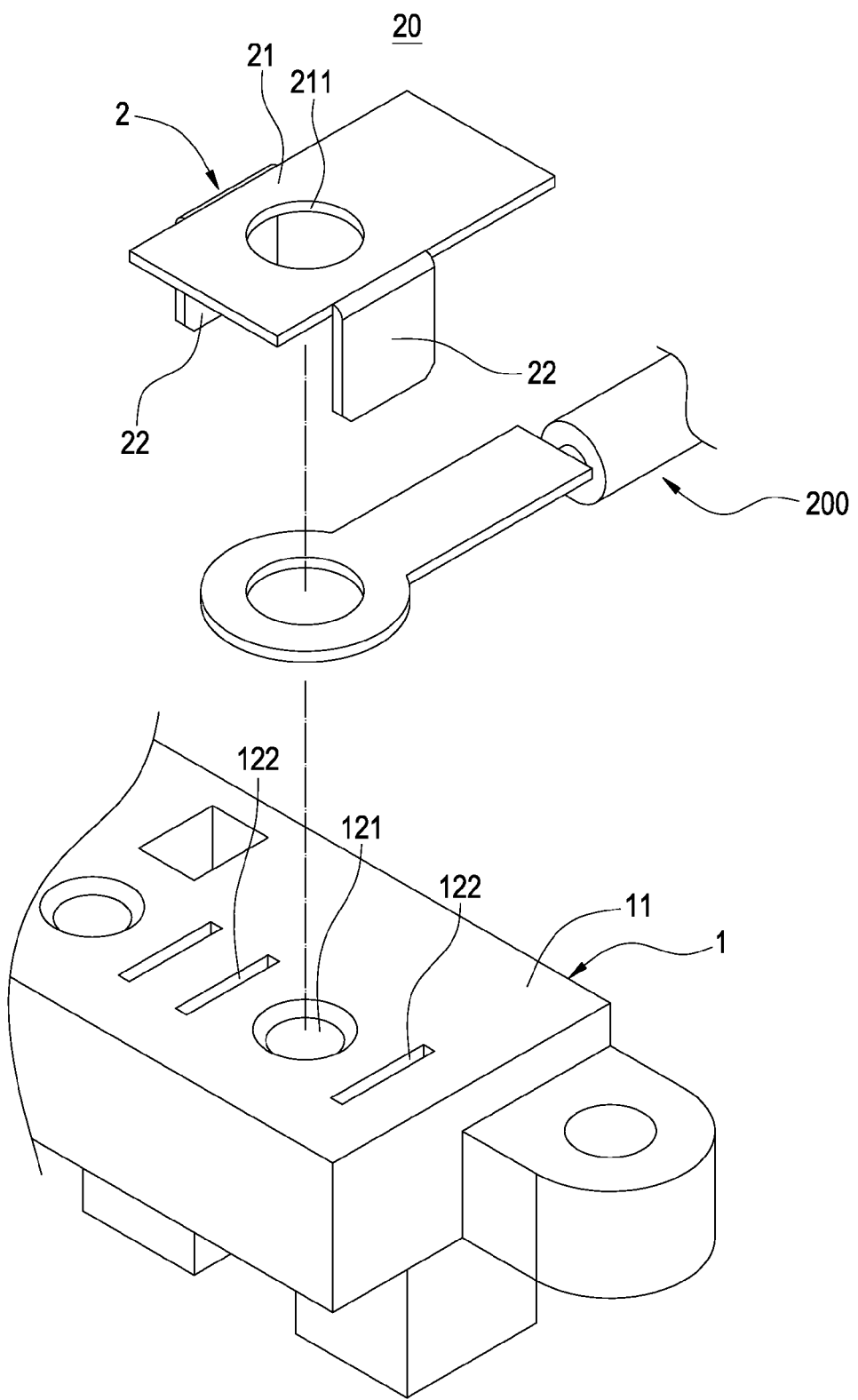
FIG. 8 is an exploded view of another embodiment of the wiring seat assembly of the invention.
Figure 9:
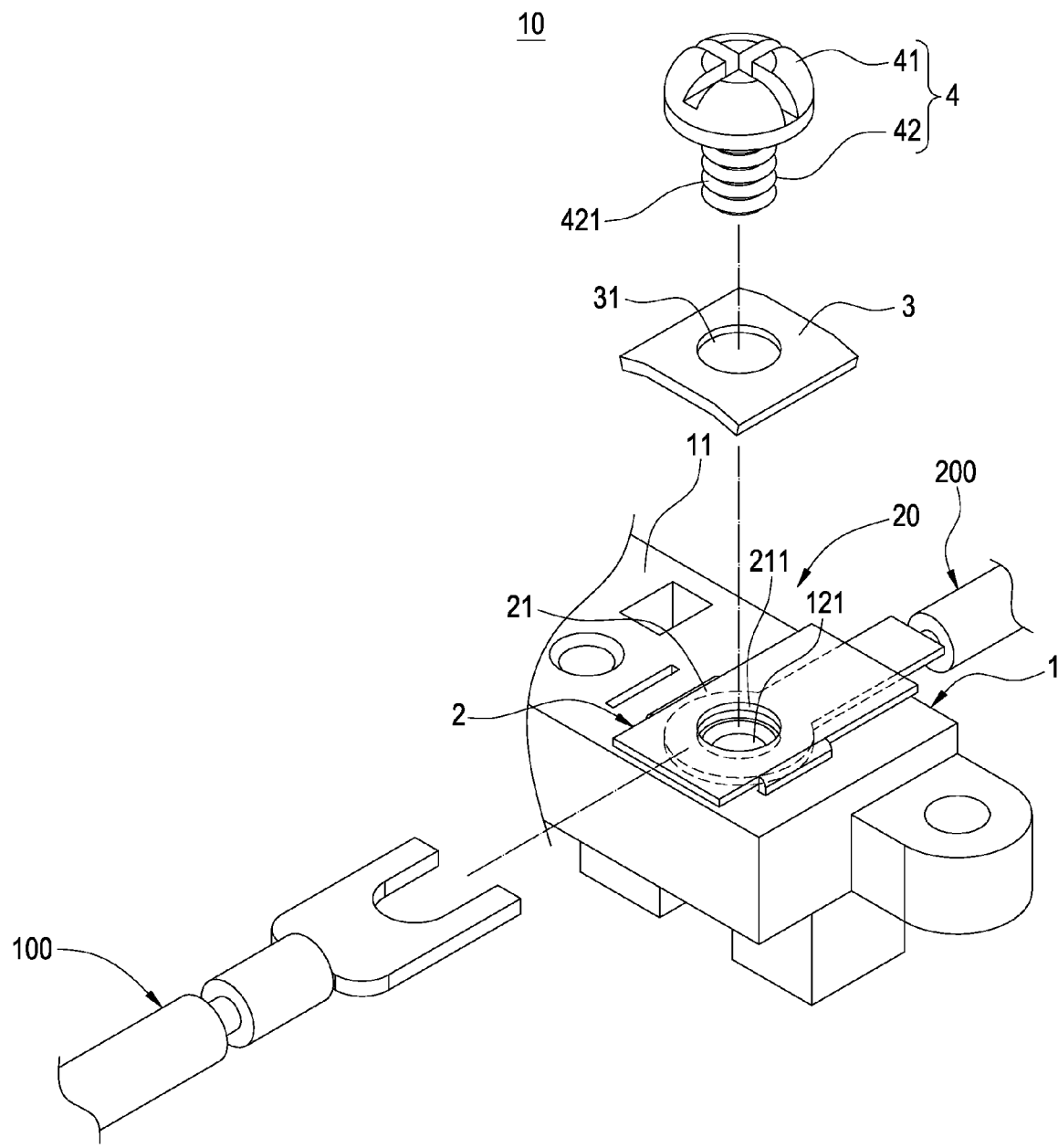
FIG. 9 is an exploded view of still another embodiment of the wiring seat assembly of the invention.

Please refer to FIGS. 8-9, which show the third embodiment of the invention. The third embodiment differs from the first embodiment by the conductive body 21 without a terminal pin 23.

In this embodiment, the insulative base 1 is not provided with a terminal pin 23 and a through hole 123 beside the fixing hole 121, but the wire 200 is clamped between the insulative base 1 and the conductive body 21 and the other wire 100 is clamped between the conductive body 21 and the pressing sheet 3. Thus the two wires 100, 200 are connected like the first embodiment.

It will be appreciated by persons skilled in the art that the above embodiments have been described by way of example only and not in any limitative sense, and that various alterations and modifications are possible without departure from the scope of the invention as defined by the appended claims.

What is claimed is:

1. An electric wiring seat assembly for a wire, comprising:
   an insulative base, having at least one fixing hole; and
   at least one connecting member, having a conductive body with a passing hole corresponding to the fixing hole and at least one screw passing through the passing hole and fastened to the fixing hole, wherein the wire is connected to the conductive body,
   wherein an inner surface of the fixing hole is formed with an inner thread for fastening with the screw so as to fix the connecting member to the insulative base,
   wherein a diameter of the fixing hole is smaller than that of the passing hole; and
   wherein the insulative base is further formed with two engagement holes located at two opposite outer sides of the fixing hole, and a through hole is formed on a side of the fixing hole other than the two engagement holes.

2. The electric wiring seat assembly of claim 1, wherein two positioning sheets are bendingly extended from the conductive body, and the positioning sheets correspond to the engagement holes to engage with each other.

3. The electric wiring seat assembly of claim 2, wherein the insulative base has a top, and the fixing hole and the two engagement holes are located in the top.

4. The electric wiring seat assembly of claim 1, further comprising a pressing sheet, wherein the pressing sheet is arranged over the conductive body and is formed with an inserting hole corresponding to the passing hole, the screw passes the inserting hole, and the wire is clamped between the conductive body and the pressing sheet.

5. The electric wiring seat assembly of claim 1, wherein the conductive body is bendingly extended with a terminal pin passing through the through hole.

6. The electric wiring seat assembly of claim 5, wherein the through hole is located before or after the fixing hole, the insulative base has a top, and the fixing hole and the through hole are located in the top.

7. The electric wiring seat assembly of claim 1, wherein the screw has a head and a rod with an outer thread, and the rod is screwed to the fixing hole by the outer thread.

8. The electric wiring seat assembly of claim 7, wherein the passing hole of the conductive body is formed with an inner thread for screwing with the outer thread.

* * * * *